United States Patent [19]

Olmstead et al.

[11] Patent Number: 5,287,071
[45] Date of Patent: Feb. 15, 1994

[54] AMPLIFIER WITH HIGH COMMON MODE REJECTION

[75] Inventors: John A. Olmstead, Cape May Court House; Salomon Vulih, Neshanic, both of N.J.

[73] Assignee: Harris Corporation, Melbourne, Fla.

[21] Appl. No.: 980,570

[22] Filed: Nov. 20, 1992

[51] Int. Cl.⁵ .............................................. H03F 3/45
[52] U.S. Cl. ..................................... 330/258; 330/257
[58] Field of Search ............... 330/252, 253, 257, 258, 330/261, 300

[56] References Cited

U.S. PATENT DOCUMENTS 5,187,448 2/1993 Brooks et al. ............... 330/258

FOREIGN PATENT DOCUMENTS 8200071 1/1982 World Int. Prop. O. .......... 330/253

Primary Examiner—Robert J. Pascal
Assistant Examiner—James Dudek
Attorney, Agent, or Firm—Henry I. Schanzer; Fred Romano

[57] ABSTRACT

A differential amplifier embodying the invention includes a differential stage whose total output current is sensed and whose "tail" and output current is maintained relatively constant over a large common mode voltage range by means of a current feedback loop. This feature eenables the differential amplifier to accurately amplify low amplitude signals riding on a very large common mode signal. The tail current to the differential amplifier is supplied by a controllable current source. The tail current flows via two differentially connected transistors in two differential output terminals and is divided between them as a function of the voltage applied to two differential signal input terminals. The amplitude of the tail current is set by a current level setting current source connected to a summing node. An amplifier and current mirroring network is connected between the summing node and the controllable current source. A current sensing and mirroring network is connected to the two differential outputs for sensing the total current flowing and feeding back a current proportional thereto to the summing node for maintaining the tail current relatively constant over wide variations in the voltage applied to the signal input terminals.

17 Claims, 5 Drawing Sheets

AMPLIFIER WITH HIGH COMMON MODE REJECTION

BACKGROUND OF THE INVENTION

This invention relates to an amplifier circuit and, in particular, to a differential amplifier circuit having a high degree of common mode rejection.

Amplifiers embodying the invention are well suited for use in amplifier systems and, in particular, in amplifier systems suitable for amplifying very low amplitude signals riding on a much higher amplitude noise component.

There are many applications where signals to be detected and amplified are part of more complex signals. By way of example, one such application includes piezoelectric devices used as the sensors to sense the rate of flow of water in a pipe. The signals produced by the sensors may have a compound form and be of the type shown in the waveform of FIG. 1. A signal may include a large amplitude slowly varying component (identified as A1 in FIG. 1) on which is superimposed a low amplitude information signal (identified as B1 in FIG. 1) having a higher frequency than the slowly varying high amplitude commponent. The large amplitude component A1 is in effect an undesirable noise component which does not contribute to the flow rate measurement. The noise component A1 is generally offset with respect to the reference direct current (DC) level and may vary from less than a volt to 10 or more volts. The "true" or information signal component B1 which rides on the noise component A1 may have an amplitude in the microvolt range.

A problem with detecting and amplifying the desired information signal, B1, is that the high amplitude slowly varying noise component, A1, tends to mask the signal of interest. This problem may be overcome, in part, by applying the true signal and the noise component to one input of a differential amplifier and, if possible, the noise component to the other input of the differential amplifier. This does tend to reduce the effect of the noise components.

However, the high amplitude noise components produce large amplitude common mode voltages which when applied to the two inputs of the differential amplifiers designed to amplify the signals of interest tend to shift their operating range. Normally, a differential amplifier is designed to be operated at a certain optimum bias level and it is desirable to maintain the bias level for optimum operation. This is particularly so where very small signals have to be sensed and amplified. Therefore, a problem exists where a small signal rides on a large common mode signal. For example, in the system under discussion a differential signal derived from a pair of sensors and applied to a differential amplifier may have an amplitude of a few microvolts while riding on a common mode voltage which may vary over virtually the full operating voltage applied to the amplifier. As the common mode voltage applied to both inputs of a differential amplifier varies over the full range of the operating voltage the bias current in the amplifier may change drastically. This change affects the gain and the output drive capabilty of the amplifier and is highly undesirable.

Another problem is that the signals of interest tend to be of smaller amplitude than the offset of the amplifiers used to amplify the signals also masking or distorting the signals. Still another problem is that it is desired to have a system which can operate at very low voltage and power.

The problems discussed above are reduced in circuits embodying the invention by using differential amplifiers to process the signals and alternating current (AC) coupling the signals to differential amplifiers specially designed to have a high degree of common mode rejection.

SUMMARY OF THE INVENTION

A differential amplifier embodying the invention includes a differential stage whose total output current level is sensed and whose "tail" and total output current is maintained relatively constant over a large common mode voltage range by means of a current feedback loop. This feature enables the differential amplifier to accurately amplify low amplitude signals riding on a very large common mode signal.

A differential amplifier stage having a high degree of common mode rejection includes first and second differential signal input terminals, first and second differential output terminals, a common node to which is connected a controllable current source supplying the tail current to the differential amplifier stage with the tail current flowing into and dividing between the two differential output terminals as a function of the voltage across the signal input terminals. A current level setting current source is connected to a summing node. An amplifier and current mirroring means responsive to a difference in the current into and out of the summing node is coupled to the controllable current source for setting the amplitude of the tail current. A current sensing and mirroring means is coupled to the two differential output terminals for sensing the total current flowing in the output terminals and feeding back a current proportional thereto to the summing node for maintaining the tail current relatively constant over wide variations in the voltage applied to the signal input terminals.

In a preferred embodiment the differential amplifier stage includes first and second transistors, each transistor having a control electrode and first and second electrodes defining the ends of a main conduction path, the conductivity of the main conduction path being a function of the voltage applied between its control and first electrodes. The control electrodes of the first and second transistors function, respectively, as the first and second differential signal inputs, and the second electrodes of the first and second transistors function, respectively, as the first and second differential output terminals, and the first electrodes of the first and second transistors are connected to the common node.

Typically, the controllable current source includes a third transistor having a control electrode connected to a control node and first and second electrodes defining the ends of its main conduction connected between the common node and a first power terminal.

Differential amplifiers embodying the invention are suitable for use in an amplifier system requiring differential amplifiers with a high degree of common mode rejection.

For example, an amplifier system may include an input stage comprising one or more differential amplifiers of the invention having a high degree of common mode rejection. The inputs of the differential amplifiers of the input stage are AC coupled to different signal input terminals which are adapted to receive information signals of very small amplitude riding on large common mode signals. The AC coupling blocks any dc level associated with the input signals from affecting the amplifier system and the high degree of common mode rejection maintains the gain of the amplifiers relatively constant over a wide range of common mode signals. The outputs of the differential amplifiers of the input stage are connected in common to an output node to sum their output signals and to reduce random noise associated with the input signals and the input stage. The output node of the input stage is AC coupled to the input of a second stage whose output is in turn AC coupled to a third output stage to reduce the effect of amplifier offsets. The gain of the amplifier system is controlled by low pass filters connected to the output node of the input stage and to the output of the second stage.

In certain embodiments a biasing clock is coupled via impedance means (e.g., resistors) to the inputs of the differential amplifiers to generate a dc bias level at their inputs which is a function of the duty cycle of the clock and the impedance means (e.g., resistor) and the coupling capacitor connected to the input.

BRIEF DESCRIPTION OF THE DRAWING

In the accompanying drawing like reference characters denote like components.

DETAILED DESCRIPTION OF THE INVENTION

A. System Description

Figure 1:
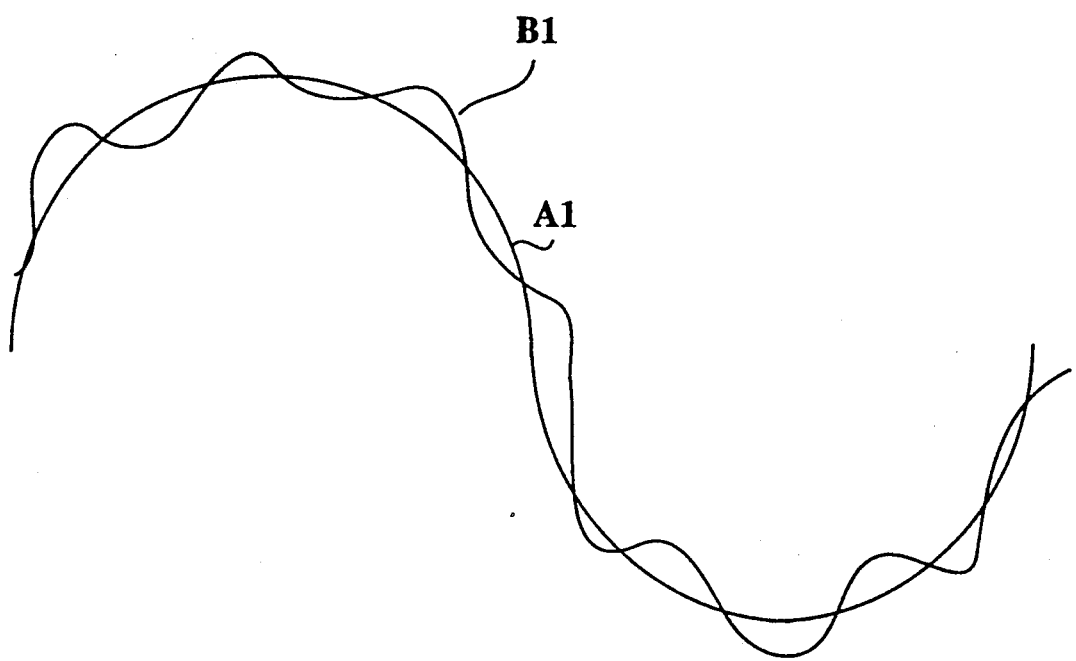
FIG. 1 is a waveform diagram of an input signal to be detected and amplified by systems embodying the invention.
Figure 2:
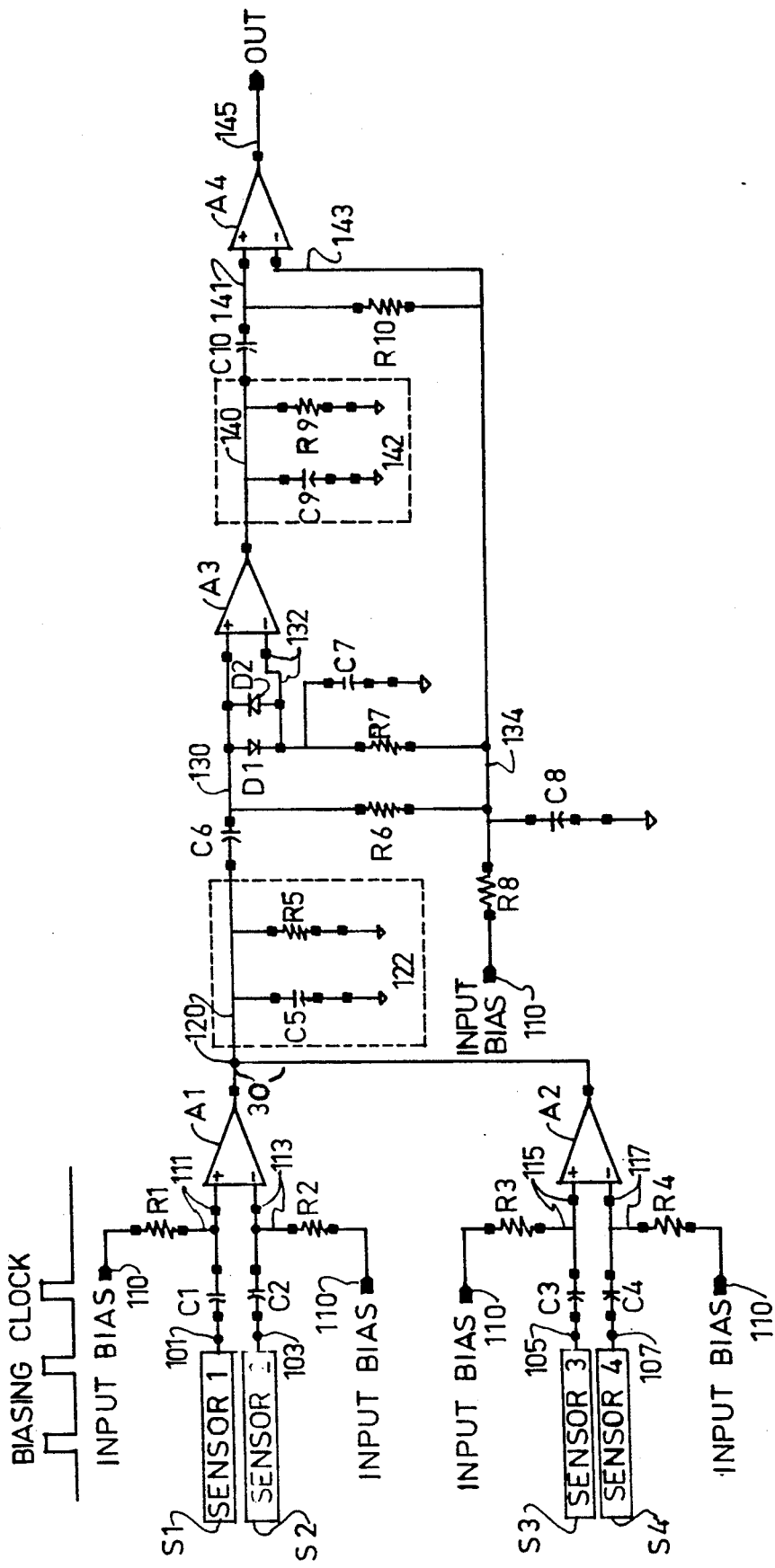
FIG. 2 is a partial schematic, partial block diagram of a system embodying the invention.

Referring to FIG. 2, there is shown a system which includes first, second, third and fourth sensors (S1, S2, S3, S4) whose outputs are respectively applied to input terminals 101, 103, 105 and 107. Sensors S1 and S2 are paired together and their outputs are AC coupled to an amplifier A1 and sensors S3 and S4 are paired together and their outputs are AC coupled to an amplifier A2. Amplifiers A1 and A2 are preferably the same and, as detailed below, are unique amplifiers providing high common mode rejection and were developed to interface to multiple sensors (e.g., S1, S2, S3 and S4) detecting essentially the same phenomenon. The paired sensors tend to have the same common mode noise signal while their "true" or information signals are out-of-phase. Terminal 101 is coupled via a capacitor C1 to the positive (+) input terminal 111 of differential amplifier (diff-amp) A1 and terminal 103 is coupled via a capacitor C2 to the negative (−) input terminal 113 of diff-amp A1.

The bias level for the inputs (111 and 113) of the diff-amp A1 is generated by the application of a clocking signal to an input bias terminal 110 with a resistor R1 connected between terminals 110 and 111 and a resistor R2, of equal value to R1, connected between terminals 110 and 113. The clocking signal applied to input bias terminal 110 is a rectangular shaped clock signal which is used to produce a DC bias at input terminals 111 and 113 of amplifier A1 whose level is a function of the duty cycle of the clock and the time constant of the resistors (R1,R2) and the capacitors (C1,C2). By adjusting the duty cycle of the rectangular wave, the DC level at the input of amplifiers A1 and A2 may be adjusted. Using a clocking signal avoids the need for a biasing scheme with steady state, constant, power dissipation. This is a significant feature where low power dissipation is needed.

The input connections to differential amplifier A2 are similar to those of A1. That is, terminal 105 is coupled via capacitor C3 to positive (+) input terminal 115 of A2 and terminal 107 is coupled via capacitor C4 to negative (−) input terminal 117 of A2. Blocking capacitors C1 through C4 decouple the D.C. portion of the sensor signal. Resistors R3 and R4, of like values to R1 and R2, are connected between terminal 110 and terminals 115 and 117, respectively. As discussed above, resistors R1, R2, R3 and R4 in conjuction with the clocking signal applied to the input bias terminal 110 and the DC blocking capacitors C1 through C4 are used to provide amplifiers A1 and A2 with a bias level about which the input signals swing.

Amplifiers A1 and A2 are preferably differential operational amplifiers of the transconductance type whose outputs are connected in common at a first output node 120. This common connection ensures that the signal outputs of amplifiers A1 and A2 are effectively summed together. The significance of the feature is that it enables the random noise associated with sensors S1 and S2 to reduce and partially cancel the random noise associated with sensors S3 and S4 while adding the signals.

A low pass filter 122 is connected to output node 120. The filter 122 includes a capacitor C5 and a resistor R5 connected in parallel between node 120 and ground potential. The signal at output node 120 is AC coupled via a capacitor C6 to terminal 130 which defines the positive (+) input terminal of a differential amplifier A3, which may be of the same type as diff-amps A1 or A2. C6 serves as a high pass coupling capacitor but also is key to blocking the offset voltage of the amplifiers A1, A2 of the first stage from entering the second stage A3 and therefore prevents saturation of its output stage. First and second diodes D1 and D2, each poled to conduct in opposite directions, are connected in parallel between node 130 and a node 132 which defines the negative (−) input terminal of diff-amp A3. Diodes D1 and D2 connected across the inputs of the second stage amplifier A3 function as clipping diodes minimizing large signal excursions. These diodes are very effective because of the high output impedance of the previous stage.

The bias level for the inputs of amplifier A3 is also generated from the biasing clock applied to input bias terminal 110. A resistor R8 is connected between input bias terminal 110 and a terminal 134 with a filtering capacitor C8 connected between node 134 and ground. The bias level generated at node 134 is thus a function of the duty cycle of the bias clock signal and the time constant of R8 and C8. A resistor R6 connected between nodes 134 and 130 and a resistor R7 connected between nodes 134 and 132 functions to couple the bias level at node 134 to the inputs of amplifier A3. R6 and R7 are made to have equal values to avoid a D.C. offset at the inputs of A3. The use of separate resistors to couple the bias separates the positive and negative inputs of amplifier A3. Capacitor C7 connected between node 132 and ground provides additional filtering. Thus, the bias arrangement of R8, C8, R6, and R7 enables a clocking signal to generate the desired bias level for amplifier A3 in a similar manner to the way the bias was set for A1 and A2.

Figure 3:
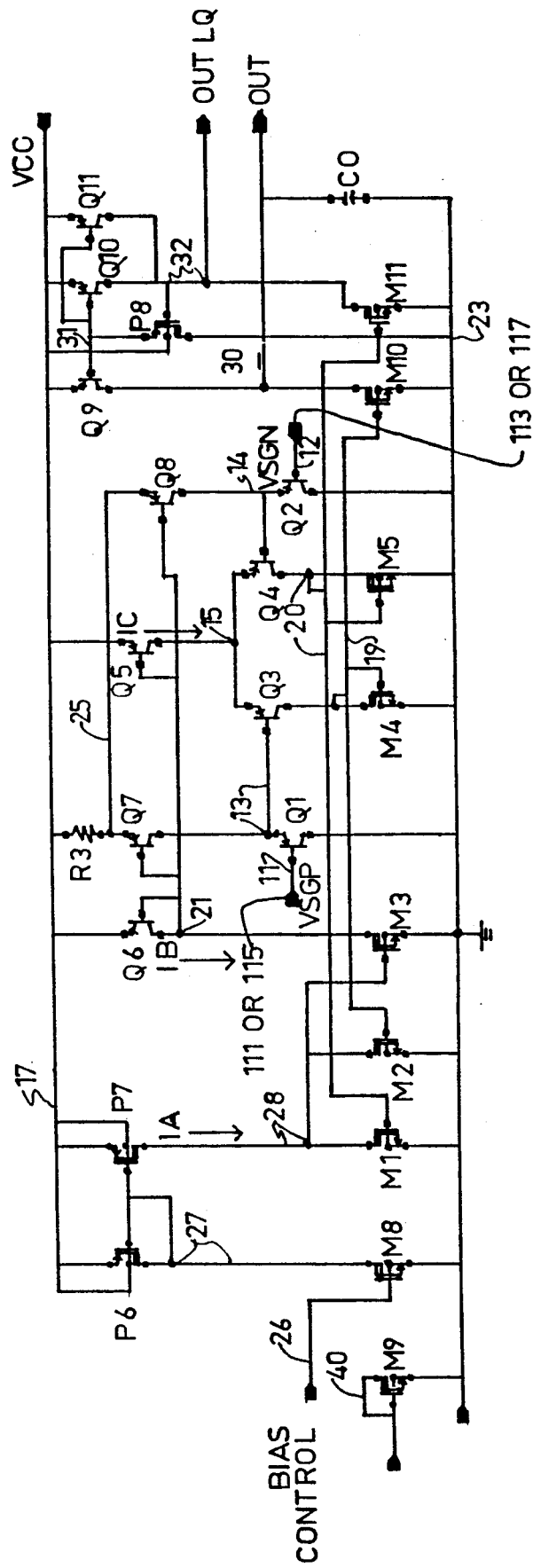
FIG. 3 is a schematic diagram of an amplifier embodying the invention.

Amplifier A3 is a differential operational transconductance amplifier which may be of the same type as A1 or A2 and as shown in FIG. 3. However, it is not necessary that it be so and A3 may be any suitable amplifier. Amplifier A3 produces an output signal at its output terminal 140 to which is connected a low pass filter 142. Filter 142 includes a capacitor C9 connected in parallel with a resistor R9 between terminal 140 and ground potential. Output terminal 140 is AC coupled by a capacitor C10 to positive (+) input terminal 141 of an amplifier comparator A4. The negative (−) input terminal 143 of amplifier A4 is connected to biasing node 134. A resistor R10 is connected between input terminals 141 and 143 of amplifier A4 to provide similar DC levels to the two inputs of A4. The signal at the positive input terminal 141 of A4 is compared to the DC level at the negative terminal 143 of A4 to produce an output signal at output terminal 145 of A4.

The system of FIG. 2 is well suited to amplify noisy sensor signals whose common mode levels are much larger than their information signal level. The system was designed to block the D.C. levels associated with the sensor outputs and to filter higher frequencies. Since the actual ("true") information signal is of smaller amplitude than the amplifier offsets, coupling capacitors C6 and C10 enables a multiple stage AC coupled system to block the D.C. offset of the amplifiers and to avoid saturating the amplifier outputs.

The system of FIG. 2 includes three stages or sections. The first stage is an input interface stage comprising differential amplifiers A1 and A2, the second stage is an amplification stage comprising amplifier A3, and the third stage is a comparator stage comprising amplifier A4. Discrete filters (122 and 142) are placed at the outputs of transconductance amplifiers A1, A2 and A3 to adjust the gain of the system.

The outputs of amplifiers A1 and A2 are connected in common whereby their output signals (actually their output currents) are summed together. As a result of the common connection, random noise from the sensors and the front stages of A1 and A2 tend to get cancelled while the signal amplitudes are added. The gain of the stage comprising A1 and A2 is limited by the low pass filter comprising external components C5 and R5, such that the offset of the stage plus the input signal times the gain of the stage does not exceed the operating voltage of the amplifier.

The output network of A3 is connected to a low pass filter network (C9 and R9), and via a high pass coupling capacitor C10 to the input of output comparator A4 which may have built-in hysteresis.

The inputs of the output comparator, A4 are set to a similar D.C. bias level as A3 by means of R8 and C8. R10 sets the two inputs of the comparator A4 to the same D.C. level. Assuming amplifier A4 to have an MOS input stage, an additional resistor is not required to be connected between the negative terminal 143 and node 134 since an MOS input stage does not draw input current and hence does not have current offset.

In brief, the system of FIG. 2 includes a unique interface circuit that is able to amplify low level signals from multiple sensors, with input signals of under 10 microvolts, to produce rail to rail outputs. This system is able to compensate for D.C. offsets of the amplifiers in the amplification chain, as well as eliminate common mode signals and random noise in the system. The system was operated with voltages down to 3.6 volts at which voltage it consumed an average of 15 microamperes.

In a particular embodiment, the following values of resistors and capacitors were used.

C1=C2=C3=C4=0.33 microfarads
C5=10 picofarads
C6=100 nanofarads
C7=0.1 microfarads
C8=0.33 microfarads
C9=10 picofarads
C10=100 nanofarads
R1=R2=R3=R4=4.7 Megohms
R5=22 Megohms
R6=R7=22 Megohms
R8=4.7 Megohms
R9=22 Megohms
R10=>Megohms

B. Amplifier Design

Amplifiers A1, A2 and A3 may be of the type shown in FIG. 3. The differential amplifier circuit of FIG. 3 includes input terminals 11 and 12, across which are applied a differential input signal with the signal applied to terminal 11 being denoted as VSGP and the signal applied to terminal 12 being denoted as VSGN. [Terminals 11 and 12 correspond, for example, to terminals 111 and 113, respectively, of A1 of FIG. 2 or to terminals 115 and 117, respectively, of A2 of FIG. 2.] Bipolar transistors Q1 and Q2 of PNP conductivity type function as emitter followers to couple the signals at terminal 11 and 12 to the bases of differentially connected PNP bipolar transistors Q3 and Q4, respectively. The base of transistor Q3 and the emitter of Q1 are connected to node 13 and the base of transistor Q4 and the emitter of Q2 are connected to node 14. The emitters of Q3 and Q4 are connected in common to node 15 to which is connected the collector electrode of PNP bipolar transistor Q5 which functions as a relatively constant, controllable, current source. The emitter of Q5 is connected to a power terminal 17 to which is applied an operating voltage of VCC volts which may, for example, be equal to any voltage ranging from above 3 volts to 15 volts. The bias (or tail) current through Q5 is controlled by means of PNP bipolar transistor Q6 connected at its emitter to terminal 17 and at its base and collector to node 21 to which is also connected the base of Q5.

The collector of Q3 is connected to an output node 19 to which is connected: (a) the gate and drain of an N-type insulated-gate field-effect transistor (IGFET) M4, functioning as a load impedance for the amplifier; (b) the gate of an N-type bias current control IGFET, M2; and (c) the gate of an N-type IGFET M10 functioning as a current sink pulling a current from the output terminal 30 to ground. The collector of Q4 is connected to an output node 20 to which is connected: (a) the gate and drain of an N-type IGFET M5, whose function is akin to that of M4; (b) the gate of an N-type bias current control IGFET M1, whose function is like that of M2; and (c) the gate of an output IGFET M11, which controls a current source (P8, Q9, Q10 and Q11) sourcing a current into output terminal 30.

The emitter follower transistors Q1 and Q2 are connected at their emitters to nodes 13 and 14, respectively and via the collector to emitter paths of transistors Q7 and Q8, respectively, to a node 25 which is connected via current limiting resistor R3 to terminal 17. The bases of Q7 and Q8 are connected to node 21. The collectors of Q1 and Q2 are connected to terminal 23 to which is applied ground potential. R3, Q7 and Q8 function as very high impedance, current limiting, sources in the emitter circuits of Q1 and Q2. For purpose of analysis and in the discussion to follow, it is assumed that Q1 and Q2 shift the voltage applied to their bases by a VBE to their emitters which are connected to the bases of Q3 and Q4. Q1 and Q3 form a darlington pair and Q2 and Q4 are another darlington pair.

The bias currents through the differential amplifier stage are established by means of the bias circuitry further described below. The gate of an N-type IGFET M8 is connected to a bias terminal 26 which may be connected to node 40 at which is present diode connected N-type IGFET M9 and/or to which is either applied a bias voltage from an external source (not shown) or a current source (also not shown) connected between the gate of M8 and an operating potential such as terminal 17. The drain of M8 is connected to the drain and gate of a P-type IGFET, P6, and the gate of a P-type IGFET, P7 at node 27. The sources of P6 and P7 are connected to terminal 17. In the circuit of FIG. 3, P6 and P7 are made the same size whereby P7 mirrors the current flowing through P6. The drain of P7 is connected at node 28 to which is also connected the drains of M1 and M2 and the gate of M3. As further detailed below, node 28 is a current summing node and P7 functions as a current source supplying a fixed current (IA) into node 28, while M1 and M2 function as current sinks drawing a current out of node 28. In FIG. 3, transistors M1, M2, M3, M4, M5, M8, M9, M10 and M11 are all IGFETs of N-conductivity type and their source electrodes are connected to node 23 which is grounded.

Figure 4:
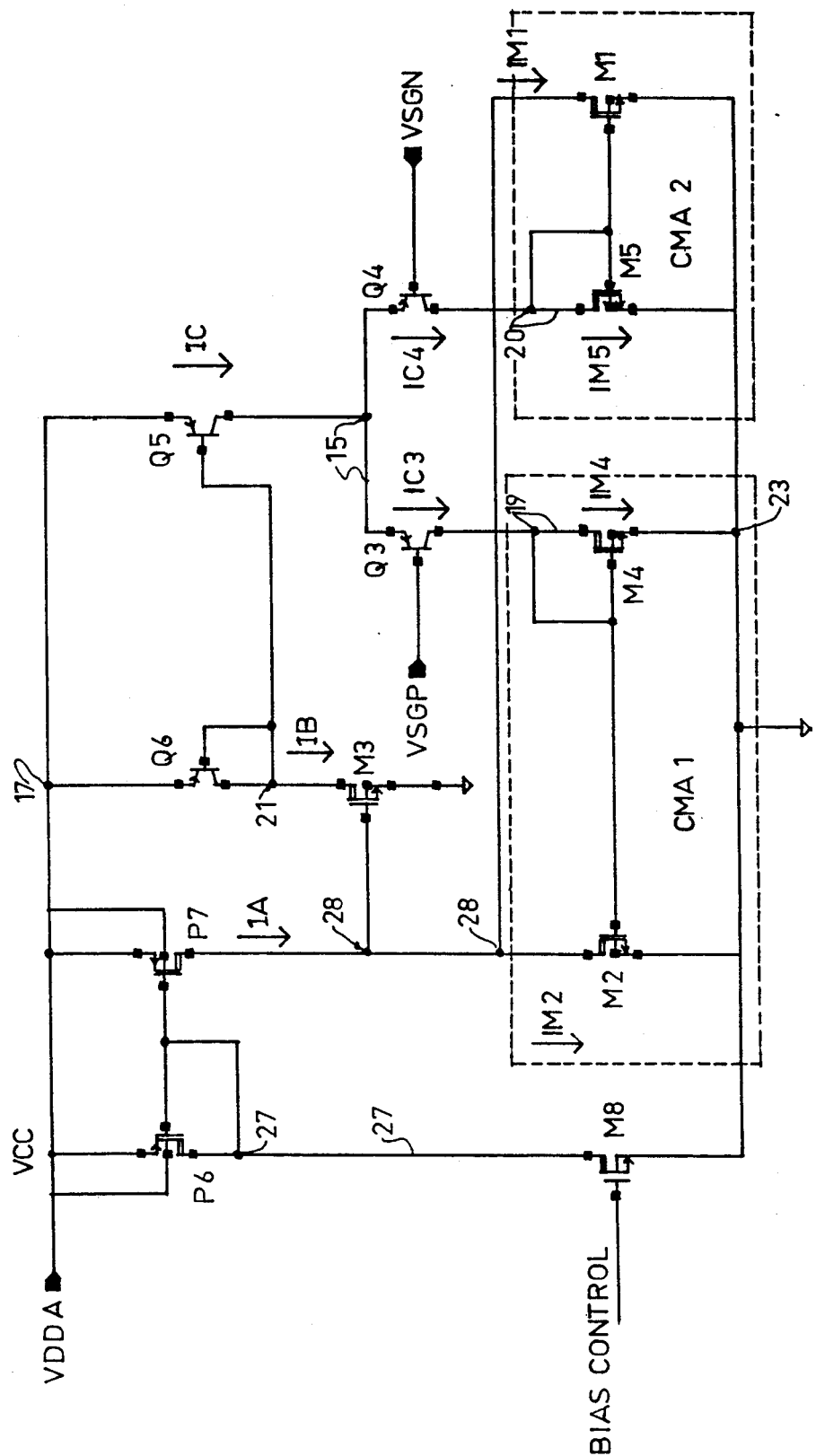
FIG. 4 is a simplified schematic diagram of the input and biasing stages of the circuit of FIG. 3.

Referring to FIG. 4, the current IA into node 28 causes a voltage to be developed at node 28 which causes M3 to turn-on and draw a current (IB) from the base and collector of Q6 and the bases of Q5, Q7 and Q8. [For ease of discussion in FIG. 4, emitter followers Q1 and Q2 and current sources Q7, Q8 and R3 are omitted. Q1 and Q3 are treated as a single transistor Q3, and Q2 and Q4 are treated as a single transistor Q4.] The current IB flows via the drain-to-source path of M3 to ground. The current in Q6 is mirrored in Q5 and, for Q6 having the same geometry as Q5, it may be assumed that Q5 is a controllable relatively constant current source producing a current IC which is equal to IB.

Within the operating range, when the same voltages are applied to the bases of Q1 and Q2, the voltages at the bases of Q3 and Q4 will also be equal and Q3 and Q4 will conduct equal currents resulting in each one of Q3 and Q4 conducting one half of the "tail" current. The collector current (IC3) of Q3 will thus be equal to IC/2 and the collector current (IC4) of Q4 will also be equal to IC/2.

IC3 flows through M4 causing a current (IM2) to flow through the drain-to-source of M2 and IC4 flows through M5 causing a current (IM1) to flow through M1. The currents through M1 and M2 are drawn from node 28 and complete a feedback loop establishing the current bias level in the differential stage (Q1/Q3, Q2/Q4). Where M1, M2, M4 and M5 are made the same size, IM1=IM2=IC3=IC4. An equilibrium bias condition is established for which IA=IB=IC=IM1+IM2=IC3+IC4. Furthermore, for VSGP equal to VSGN, IM1=IM2=IC3=IC4.

Figure 5:
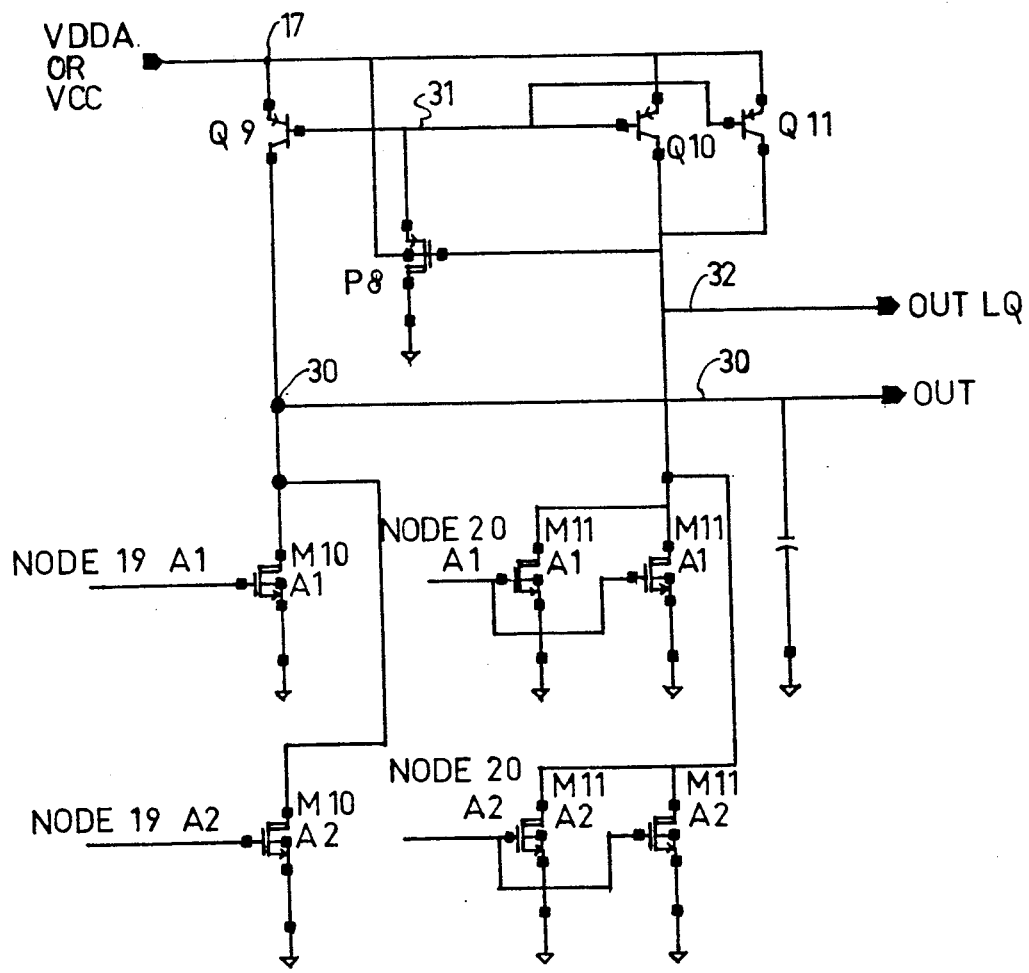
FIG. 5 is a schematic diagram of the output stage of FIG. 3.

Referring to FIGS. 3 and 5 the output stage of the amplifier includes an N-channel IGFET M10 having its gate connected to node 19, its drain to an output terminal 30 and its source to ground terminal 23. In response to positive going signals at node 19, M10 conducts and functions like a current sink drawing ("sinking") current from terminal 30 into terminal 23. The output stage also includes a current sourcing circuit to supply a current into terminal 30. The current sourcing circuit includes an N-channel IGFET M11 having its gate connected to node 20, its source connected to ground and its drain to an output terminal 32. A P-type IGFET P8 is connected at its gate to terminal 32, at its drain to ground and at its source to node 31 to which is connected the bases of P-type bipolar transistors Q9, Q10 and Q11. The collector of Q9 is connected to output terminal 30, the collectors of Q10 and Q11 are connected to output terminal 32 and the emitters of Q9, Q10 and Q11 are returned to terminal 17.

In response to a positive going signal at node 20, M11 tends to conduct and functions to draw current out of node 32, turning on P8 and causing P8 to conduct base current out of the bases of Q9, Q10 and Q11 and via its source-to-drain path to ground. The base currents drawn out of Q9, Q10 and Q11 cause Q9 to supply (or source) a current into output terminal 30 and Q10 and Q11 (which are connected in parallel) to supply (or source) a current into output terminal 32. Thus, when node 19 is more positive than node 20 (which corresponds to VSGP being less than VSGN), more current is drawn out of terminal 30 than is supplied to it and the voltage at output terminal 30 goes low. When node 20 is more positive than node 19 (which corresponds to VSGP being more positive than VSGN) more current is supplied to output terminal 30 than is drawn from it and the voltage at output terminal 30 goes high.

The operation of the current biasing arrangement in the circuit of FIG. 3 may be more easily explained with reference to FIG. 4 which is a simplified version of the input and biasing section of FIG. 3.

For ease of the explanation to follow, assume Q5 and Q6 are the same size, whereby, for the same bias condition, Q5 will mirror on a 1:1 basis the current through Q6. Assume also that differentially connected transistors Q3 and Q4 are the same size, whereby for the same voltage (i.e. common mode) applied to their bases, they will conduct equal currents. Assume further that M1, M2, M3, M4 and M5 are all the same size.

For this design, it can be shown that a stable bias current equilibrium condition is established and that the bias circuitry forms a current feedback loop which corrects for changes in the common mode voltage.

For ease of description, it should be noted that M4 and M2 form a first current mirror amplifier (CMA1) and M5 and M1 form a second current mirror amplifier (CMA2). The input to CMA1 is node 19 and the drain current into M4 and the output of CMA1 is the drain of M2 and its drain current. The input to CMA2 is node 20 and the drain current into M5 and the output of CMA2 is the drain of M1 and its drain current. When M1, M2, M4 and M5 are all made to have the same size, it follows that for like gate-to-source voltages, they will conduct like drain-to-source currents. The collector current IC3 of Q3 flows through M4 and causes a like current to flow through M2. Likewise, the collector current IC4 of Q4 flows through M5 and causes a like current to flow through M1.

Based on the conditions discussed above, the bias currents in the amplifier reach an equilibrium condition. For Q5 and Q6 being the same size and Q3 and Q4 being the same size, and for M1, M2, M3, M4 and M5 being the same size, and for the same voltages applied to the bases of Q3 and Q4, the currents IA, IB and IC are equal to each other and one-half of IC flows through each of Q3 and Q4 and through M4, M5, M2 and M1. But it should be noted that it is IA which sets and determines the values of IB and IC. If IA increases or decreases, IB and IC will likewise increase or decrease.

This is demonstrated as follows: Assume that initially IM1 and IM2 are zero. Current IA charges node 28 and causes M3 to conduct a current IB which is mirrored via Q6 into Q5 causing a current IC to flow through Q3 and Q4 into M4 and M5. The currents through M4 and M5 are mirrored into M1 and M2. IB and IC increase until IM1+IM2=IA, at which point equilibrium is reached. When equilibrium is reached and assuming VSGP=VSGN, the gate-to-source voltages (VGS) and the gate-to-drain voltages (VDS) of M4 and M5 are equal to each other. Since M1=M2=M4=M5, and the VGS of M1 and M2 are equal to those of M4 and M5, the currents trough M1 and M2 will equal those through M5 and M4, respectively. However, the VDS of M1 and M2 tend to be higher than the VDS of M4 and M5 whereby M1 and M2 are operated in the saturation region (i.e., above or beyond the knee of the IDS versus VDS curve). The significance of this feature is that M1 and M2 are operated in a region where their output impedance is greater and they function as stiffer current sources. The net result is that for small differences in current at node 28, larger voltages are produced. As for M3, note that its VGS is equal to the VDS of M1 and M2. However, M3 conducts a cuurent equal to that of M1 or M2. Now, since M3 is the same size as M1 and M2, its VDS must be greater than their VDS and VGS. This causes M3 to be operated even deeper in saturation than M1 or M2 whereby its gain is increased, increasing the loop gain.

For the established equilibrium condition noted above, it may be shown that the bias condition will remain constant over a wide range of common mode voltage variations.

Assume that the input voltages to the differential amplifier are equal (VSGP=VSGN) and that they are increasing towards VCC. The voltage at their emitters (node 15) increases correspondingly, cauusing IC to decrease because of the decreased collector-to-emitter voltage of Q5. The decrease in IC results in a decrease in IM4 and IM5. A decrease in IM4 and IM5 is mirrored to M1 and M2 causing a decrease in IM1 and IM2. When this occurs, less current is drawn out of node 28 and IA, which tends to remain constant and unaffected by the change in common mode voltage, causes the gate voltage of M3 to rise and the conductivity of M3 to increase. The increased conductivity of M3 causes an increase in IB which is mirrored to Q5 causing IC to increase and IM4 and IM5 to increase until IM1+IM2=IA. Thus, as the common mode voltage applied to the differential amplifier inputs varies, the bias current level remains constant (so long as IA remains constant).

Referring to FIGS. 3 and 4, the operation of the closed loop may also be described as follows. Assume, for example, that VSGP is equal to VSGN is equal to Vcc/2. For this condition, a quiescent current IC flows through Q5, IC/2 flows through Q3 and Q4. Like currents (i.e. IC/2) flow through M4 and M5. The currents IC/2 through M4 and M5 develop a potential (VGS=VDS) which is applied across the gate-to-source of M1 and M2. Since M1 and M2 are the same size as M4 and M5, they will each pass like currents IC/2 and develop a gate-to-source voltage equal to that developed across M4 and M5. M3, which is the same size as M1 and M2, must conduct a current equal to the current of M1 and M2, whereby M3 is operated with a VDS greater than its VGS and is therefore placed in a high gain region. The current IB through M3 is drawn through Q6. The current 11 through Q6 is mirrored through Q5, closing the loop.

As a result of the closed current feedback loop, there is compensation when the common mode voltage applied to the bases of Q3 and Q4 rises towards Vcc such that the current through Q5 decreases, causing the currents through Q3 and Q4 to decrease. If the currents through Q3 and Q4 decrease, there is a like decrease in the current through M4 and M5. A decrease in the currents through M4 and M5 causes a decrease in their gate and drain-to-source potential, causing a like decrease in the gate-to-source voltage of M1 and M2. M1 and M2 will then tend to sink less current. However, the current (IA) into the drain of M1 and M2 remains at some constant value. As a result, the voltage across the drain-to-source of M1 and M2 (and hence, at the gate of M3) increases, causing the conductivity of M3 to increase. The increased conductivity of M3 causes Q6 to conduct more current tending to increase the conductivity of Q5 and restore the current level of the equilibrium condition flowing through it. As discussed above, the current IA "sourced" into node 28 is summed with the feedback currents IM1 plus IM2 "sunk" out of node 28. The difference between the total "sourced" current and the total "sunk" current is amplified by M3 and mirrored via Q6 through Q5 to produce the "tail" current which then flows through Q3 and Q4. Also, as discussed above, M1 and M2 (and also M3) are operated in the saturated region where their output impedance tends to be higher so that larger voltage changes are produced at their drains for a given change in their VGS. The significance of this feature is that it provides increased amplifier gain and better control of the common mode rejection.

In the operation of the differential amplifier in response to a differential input signal, the tail current (IC) will divide between Q3 and Q4 as dictated by the input voltage. That is, if VSGP is more positive than VSGN, IM5 increases and IM4 decreases and vice versa, if VSGP is more negative than VSGN, IM4 increases and IM5 increases. However, IM4 plus IM5 remain equal to IC and likewise, the mirrored current IM1 plus IM2 remains equal to IA.

What is claimed is:
1. The combination comprising:
 a differential signal input terminals, first and second differential signal input terminals, first and second differential output terminals, a common node to which is connected a controllable current source supplying the tail current to the differential amplifier stage, the tail current flowing into and dividing between the two differential output terminals as a function of the voltage across the signal input terminals;

a current level setting current source connected to a summing node;

an amplifier and current mirroring means responsive to a difference in the current into and out of the summing node coupled to the controllable current source for setting the amplitude of the tail current; and a current sensing and mirroring means coupled to the two differential output terminals for sensing the total current flowing in the output terminals and feeding back a current proportional thereto to the summing node for maintaining the tail current relatively constant over wide variations in the voltage applied to the signal input terminals.

2. The combination as claimed in claim 1 wherein said differential amplifier stage includes first and second transistors, each transistor having a control electrode and first and second electrodes defining the ends of a main conduction path, the conductivity of the main conduction path being a function of the voltage applied between its control and first electrodes;

the control electrode of the first transistor defining said first differential signal input, the control electrode of the second transistor defining said second differential signal input, the second electrode of said first transistor defining said first differential output terminal, the second electrode of said second transistor defining said second differential output terminal and the first electrodes of the first and second transistors being connected to the common node.

3. The combination as claimed in claim 2 wherein said controllable current source includes a third transistor having a control electrode and first and second electrodes defining the ends of a main conduction path;

wherein the third transistor is connected at its second electrode to said common node and at its first electrode to a first power terminal.

4. The combination as claimed in claim 3 wherein said current sensing means includes first and second current mirror amplifiers (CMAs); each CMA having an input and an output;

said first CMA being connected at its input to said first differential output terminal and at its output to said summing node; and said second CMA being connected at its input to said second differential output terminal and at its output to said summing node.

5. The combination as claimed in claim 4 wherein said first CMA includes a fourth and a fifth transistor and said second CMA includes a sixth and seventh transistor; each one of said fourth through seventh transistors having a control electrode and first and second electrodes defining the ends of a main conduction path;

wherein the control and second electrodes of the fourth transistor and the control electrodes of the fifth transistor are connected to said first differential output terminal;

wherein the control and second electrodes of the sixth transistor and the control electrode of the seventh transistor are connected to said second differential output terminal;

wherein the second electrodes of the fifth and seventh transistors are connected to said summing node; and wherein the first electrodes of said fourth, fifth, sixth and seventh transistors are connected to a second power terminal.

6. The combination as claimed in claim 5 wherein said amplifying and current mirroring means includes an eighth and a ninth transistor; each transistor having a control electrode and first and second electrodes defining the ends of a main conduction path;

wherein the eighth transistor is connected at its control electrode to the summing node and at its first electrode to the second power terminal; wherein the ninth transistor is connected at its first electrode to the first power terminal; and wherein the conrol electrode of the third transistor and the control and second electrodes of the ninth transistor are connected to the second electrode of the eighth transistor.

7. The combination as claimed in claim 6 wherein said current level setting current source includes a tenth transistor having a control electrode and first and second electrodes defining the ends of a main conduction path;

wherein the tenth transistor is connected at its first electrode to the first power terminal and at its second electrode to the summing node; and wherein a fixed turn-on signal is applied to the control electrode of the tenth transistor.

8. The combination comprising, a differential amplifier having first and second differentially connected transistors; each transistor having first and second electrodes defining the ends of a main conduction path and a control electrode, the conductivity of each transistor being a function of the potential applied between its control and first electrodes;

means for applying voltages to the control electrodes of the first and second transistors;

means connecting the first electrodes of said first and second transistors to a common node;

a first controllable current source connected between said common node and a first power terminal for the application thereto of an operating potential;

first and second current mirror amplifiers (CMA), each CMA having an input and an output.

means respectively connecting the inputs of the first and second CMAs to the second electrodes of the first and second transistors;

a summing node;

means connecting the outputs of the first and second CMAs to said summing node for supplying first and second currents of the same one polarity to said summing nodes;

a bias current generating means coupled to said summing node for supplying a bias current thereto of opposite polarity to that of said first and second currents of said first and second CMAs; and means coupled between said summing node and said first controllable current source responsive to the voltage at said summing node for maintaining the current of said first controllable current source relatively constant in response to like voltages applied to the control electrodes of said first and second transistors.

9. The combination as claimed in claim 8, wherein said first controllable current source includes a third transistor having its conduction path connected between said common node and said first power terminal.

10. The combination as claimed in claim 9, wherein said means coupled between said summing node and said first controllable current source includes:

(a) a fourth transistor having its first electrode connected to said first power terminal and its control and second electrodes connected to the control electrode of said third transistor at a first intermediate node; and (b) a fifth transistor having its control electrode connected to said summing node and its conduction path connected between said first intermediate node and a second power terminal for the application thereto of an operating potential.

11. The combination as claimed in claim 10, wherein said first CMA includes a first input transistor having its control and second electrodes connected to the second electrode of said first transistor at a first output node and its first electrode connected to said second power terminal and a first output transistor having its control electrode connected to said first output node and its conduction path connected between said summing node and said second power termianl; and wherein said second CMA includes a first input transistor having its control and second electrodes connected to the second electrode of said second transistor at a second output node and its first electrode connected to said second power terminal and a first output transistor having its control electrode connected to said second output node and its conduction path connected between said summing node and said second power terminal.

12. The combination as claimed in claim 11, wherein said fifth transistor and the transistors of the first and second CMAs are of the same conductivity type and are similarly sized.

13. The combination as claimed in claim 12, wherein said first and second transistors are of the same conductivity type and are similarly sized; and wherein said third and fourth transistors are of the same conductivity type and are similarly sized.

14. The combination as claimed in claim 13, wherein said first, second, third and fourth transistors are bipolar transistors and wherein said fifth transistor and said CMA transistors are insulated-gate field-effect transistors (IGFETs).

15. A differential amplifier comprising:

a plurality of transistors, each transistor having first and second electrodes defining the ends of a main conduction path and a control electrode, and wherein the conductivity of the main conduction path of each transistor is a function of the potential applied between its control and first electrodes;

first and second input terminals for the application there between of an input signal;

means connecting the control electrode of a first one of said plurality of transistors to said first input terminal and the control electrode of a second one of said plurality of transistors to said second input terminal;

a first controllable, relatively constant current source connected between the first electrodes of said first and second transistors and a first power terminal for supplying a quiescent current to said first and second transistors;

a third transistor having its second and control electrodes connected to the second electrode of said first transistor at a first output node;

a fourth transistor having its second and control electrodes connected to the second electrode of said second transistor at a second output node;

means connecting the first electrodes of said third and fourth transistor to a second power terminal;

a fifth transistor having its control electrode connected to said first output node and a sixth transistor having its control electrode connected to said second output node;

a summing node;

means connecting the second electrodes of said fifth and sixth transistors to said summing node and their first electrodes to said second power terminal;

means for supplying a bias current to said summing node;

a seventh transistor having its control electrode connected to said summing node and its first electrode to said second power terminal; and means coupled between the second electrode of said seventh transistor and the first controllable current source for controlling the current through said first controllable current source as a function of the conductivity of said seventh transistor.

16. The combination as claimed in claim 15, wherein said first and second transistors are bipolar transistors; and wherein said first current source includes an eighth bipolar transistor having its collector-to-emitter path connected between the emitters of the first and second transistors and said first power terminal.

17. The combination as claimed in claim 15, wherein said third, fourth, fifth, sixth and seventh transistors are insulated-gate field-effect transistors (IGFETs), wherein said control electrode is the gate, said first electrode is the source and said second electrod is the drain of these transistors; and wherein said third, fourth, fifth, sixth and seventh transistors are of the same size.

* * * * *